(12) United States Patent
Heinemann et al.

(10) Patent No.: US 7,880,270 B2
(45) Date of Patent: Feb. 1, 2011

(54) VERTICAL BIPOLAR TRANSISTOR

(75) Inventors: Bernd Heinemann, Frankfurt (DE); Holger Rücker, Bad Saarow (DE); Jürgen Drews, Frankfurt (DE); Steffen Marschmeyer, Frankfurt (DE)

(73) Assignee: IHP GmbH—Innovations for High Performance Microelectronics/ Leibniz-Institut fur innovative Mikroelektronik, Frankfurt (DE)

( * ) Notice: Subject to any disclaimer, the term of this patent is extended or adjusted under 35 U.S.C. 154(b) by 536 days.

(21) Appl. No.: 11/792,015
(22) PCT Filed: Dec. 12, 2005
(86) PCT No.: PCT/EP2005/056691

§ 371 (c)(1),
(2), (4) Date: May 30, 2007

(87) PCT Pub. No.: WO2006/061439

PCT Pub. Date: Jun. 15, 2006

(65) Prior Publication Data

US 2009/0179303 A1 Jul. 16, 2009

(30) Foreign Application Priority Data

Dec. 11, 2004 (DE) ........................ 10 2004 061 327

(51) Int. Cl.
*H01L 29/732* (2006.01)
(52) U.S. Cl. ........................ 257/586; 257/197; 257/516; 257/E29.183
(58) Field of Classification Search ................ 257/197, 257/198, 200, 257, 586, E29.183, E21.37, 257/516, 517; 438/309
See application file for complete search history.

(56) References Cited

U.S. PATENT DOCUMENTS 5,166,767 A 11/1992 Kapoor et al.

(Continued)

FOREIGN PATENT DOCUMENTS

DE 39 01 881 A1 8/1989

(Continued)

OTHER PUBLICATIONS

IEEE 0-7803-7873-03/03/2003; Katsuyoshi Washio; "SiGE HBT and BiCMOS Technologies"; pp. whole document; 2003; Central Research Laboratory, Hitachi, Tokyo.

(Continued)

*Primary Examiner*—Thinh T Nguyen
(74) *Attorney, Agent, or Firm*—Ware, Fressola, Van Der Sluys & Adolphson LLP

(57) ABSTRACT

A vertical heterobipolar transistor comprising a substrate of semiconductor material of a first conductivity type and an insulation region provided therein, a first semiconductor electrode arranged in an opening of the insulation region and comprising monocrystalline semiconductor material of a second conductivity type, which is either in the form of a collector or an emitter, and which has a first heightwise portion and an adjoining second heightwise portion which is further away from the substrate interior in a heightwise direction, wherein only the first heightwise portion is enclosed by the insulation region in lateral directions perpendicular to the heightwise direction, a second semiconductor electrode of semiconductor material of the second conductivity type, which is in the form of the other type of semiconductor electrode, a base of monocrystalline semiconductor material of the first conductivity type, and a base connection region having a monocrystalline portion which in a lateral direction laterally surrounds the second heightwise portion, which is further towards the substrate interior as viewed from the base, of the first semiconductor electrode, and which rests with its underside directly on the insulation region.

25 Claims, 14 Drawing Sheets

U.S. PATENT DOCUMENTS

| | | | | |
|---|---|---|---|---|
| 5,175,603 | A | * | 12/1992 | Hamasaki ................. 257/592 |
| 5,346,840 | A | * | 9/1994 | Fujioka ..................... 438/312 |
| 6,642,553 | B1 | | 11/2003 | Drews et al. |
| 2007/0278621 | A1 | | 12/2007 | Rucker et al. |

FOREIGN PATENT DOCUMENTS

| | | |
|---|---|---|
| DE | 197 58 339 C2 | 12/1997 |
| DE | 197 58 339 C2 | 6/1999 |
| EP | 0 669 647 | 8/1995 |
| EP | 0 669 647 | 5/2001 |
| JP | 61288467 | 12/1986 |
| JP | 04241422 | 8/1992 |
| JP | 05166380 | 7/1993 |

OTHER PUBLICATIONS

The Electrochemical Society Inc.; T.K. Cams, et al.; "Chemical Etching of $Si_{1-x}$, $GE_x$ in $HF:H_2O_2:CH_3COOH$"; J. Elecrochem. Soc., vol. 142, No. 4; pp. 1260-1266; Apr. 1985; Device Research Laboratory, Los Angeles CA.

Katsuyoshi Washio, SiGE HBT and BiCMOS Technologies; 0-7803-7873-03/03/2003 IEEE; Central Research Laboratory, Tokyo.

T.K. Carns, et al., Chemical Etching o $Si_{1-x}$, $Ge_x$ in $HF:H_2O_2:CH_3COOH$; Device Research Laboratory, Los Angeles CA, J. Elecrochem. Soc., vol. 142, No. 4 Apr. 1985; The Electrochemical Society Inc.

U.S. Appl. No. 10/580,669, filed Mar. 19, 2007, Holger Rucker et al.

* cited by examiner

VERTICAL BIPOLAR TRANSISTOR

CROSS REFERENCE TO RELATED APPLICATIONS

This application is for entry into the U.S. national phase under §371 for International Application No. PCT/EP05/056691 having an international filing date of Dec. 12, 2005, and from which priority is claimed under all applicable sections of Title 35 of the United States Code including, but not limited to, Sections 120, 363 and 365(c), and which in turn claims priority under 35 USC §119 to German Patent Application No. 10 2004 061 327.3 filed on Dec. 11, 2004.

BACKGROUND OF THE INVENTION

1. Technical Field

The invention concerns a bipolar semiconductor device, in particular a vertical heterobipolar transistor (HBT). The invention further concerns a process for the production of such a bipolar semiconductor device.

2. Discussion of Related Art

The efficiency of silicon-based bipolar transistors (also referred to in English as: bipolar junction transistor or BJT) has been considerably improved in the high-speed range by novel structural element constructions and material components as well as reduction in structural size.

Essential features of modern vertical high-sped bipolar transistors are described in K Washio, 'SiGe HBT and BiCMOS Technologies', IEDM, pages 113-116, 2003.

Known design configurations include highly conductive base and collector connection regions which lead the charge carrier flow from the inner transistor region towards the corresponding contact regions. In order at the same time to ensure a low capacitance in respect of the base connection region in relation to the other electrical connections of the transistor the semiconductor regions are separated from each other by insulator regions with a low dielectric constant, for example by silicon dioxide. So-called double polysilicon technology or single polysilicon technology with differential base epitaxy have become established as the production processes for that structural feature.

The state of the art attained in that respect however, for both variants, requires a compromise between very low feed lead resistances on the one hand and very low capacitances or good values in respect of the functional transistor yield on the other hand.

That relationship is illustrated for the double polysilicon technology in relation to FIG. 1. FIG. 1 shows a cross-sectional view of a bipolar transistor in accordance with the state of the art, which in its essential features corresponds to the transistor of FIG. 1(a) from the above-mentioned publication by Washio. A collector region 20 adjoins downwardly a substrate 10 and laterally recesses 11 in the silicon, which are filled with silicon dioxide ($SiO_2$) and which are also referred to as field insulation regions. In that respect, various design configurations in accordance with the state of the art use either shallow field insulation regions in the form of shallow trenches (referred to in English as shallow trench isolation or STI), as shown in FIG. 1, or alternatively deeper trenches, referred to as deep trenches.

In a vertical direction the collector region 20 is composed of a highly doped collector region 21 disposed at the substrate side and a lowly doped collector region 23 disposed thereabove. Portions 22 of a collector connection region adjoin the collector region in a lateral direction under the STI regions 11.

A window 34 is produced over the collector region 20 in a layer stack comprising a first insulator layer 30, a polysilicon layer 31 and a second insulator layer 32. By selective etching of the first insulator layer 30 a portion of the polysilicon layer 31, which projects laterally beyond the first insulator region 30, is produced at the lateral edge of the window 34. The ends of the overhanging portions of the polysilicon layer 31 are provided with spacers 50 of insulator material.

During a selective epitaxy step for the production of a base layer 40 silicon fronts grow at the same time from the exposed portions of the polysilicon layer 31 and the collector region 20 towards each other in a vertical direction and close the gap between the polysilicon layer 31 serving as part of the base connection region, and the inner transistor region.

A T-shaped emitter region 60, with a vertical portion which corresponds to the vertical bar of the T-shape, adjoins the base layer 40 downwardly and adjoins the spacers 50 laterally. Deposited over the SiGe layer is a cap layer which can receive dopants which diffuse in the production process out of the emitter and which can receive at least a part of the base-emitter space charge zone. The emitter-side boundary of the cap layer is indicated by a separation line in the emitter. Portions of the emitter 60, which correspond to the horizontal bar of the T-shape, rest sideways on the second insulator layer 32.

A further typical feature of that known transistor structure is a selectively implanted collector (SIC) region 33 in which the level of collector doping is locally raised in order at the same time to minimise the collector-base transit time, the base-collector capacitance and the collector resistance, in a way which permits good high-speed properties on the part of the transistor.

If consideration is given to the collector arrangement shown in FIG. 1, more weakly doped silicon regions 23 exist in the collector region laterally of the SIC region 33. The silicon regions 23, because of their increased electrical resistance, do not make any noticeable contribution to transport of the collector current, but at least in a part of the overhanging portions of the polysilicon layer 31 cause parasitic contributions to the base-collector capacitance.

That parasitic capacitance component could be reduced without disadvantages in terms of other transistor properties, if it were to be successfully possible to replace the low-doped silicon region laterally adjoining the SIC region by $SiO_2$.

It would be possible to envisage manufacturing that apparatus feature by way of a reduction in the width of the inner collector region, more specifically in such a way that the opening of the first insulator layer 30 also extends partially over the STI regions 11, by the lateral boundary of the first insulator layer 30 projecting beyond the collector region.

Using the typical production procedures for that transistor structure however that process would involve consequences in terms of base resistance, which would be intolerably harmful, because the selective growth behaviour during the epitaxial step would mean that the full width of the gap under the overhanging portion of the polysilicon layer 31 would no longer be filled with silicon. Furthermore there is also a substantially increased danger that crystal defects project into the active transistor region and the functional transistor yield is thus adversely affected.

FIG. 2 shows a cross-sectional view of a further vertical bipolar transistor in accordance with the state of the art. FIG. 2 diagrammatically shows a portion of the inner transistor region as well as the adjoining base and collector connection regions. The transistor in FIG. 2 has a single polysilicon structure with differentially deposited base. Essential features of the collector structure are the same as those of the double polysilicon variant shown in FIG. 1.

A collector 120 is enclosed downwardly by a substrate 110 and towards the sides by STI regions 111. The collector 120 has a highly doped portion 121 at the substrate side. Towards the surface the collector has a lowly doped portion 123. Unlike the double polysilicon structure of FIG. 1 in which deposit of the polysilicon layer 31 is effected independently of that of the base layer, the single polysilicon variant provides that polycrystalline semiconductor material 130 is deposited during the differential epitaxy step for base production on the field insulation regions, and that polycrystalline semiconductor material 130 can be used as part of the base connection region.

The processes described in patent application No DE 10358046.8 to the present applicants, which has not yet been published, can be used for production of the emitter structure 160 shown in FIG. 2.

For the reasons described hereinbefore an SIC region 133 is used just as in the double polysilicon variant. The known single polysilicon transistor structures also typically have more weakly doped silicon regions in lateral proximity with the SIC region 133, which cause unwanted capacitance contributions between the base connection and collector region.

It will be noted however that the above-described procedure for reducing that parasitic capacitance, in which more specifically the lateral extent of the collector region were reduced with the width of the emitter window being maintained, would not inevitably cause an increase in the base resistance in the case of single polysilicon technology. With a displacement of the STI regions 111 however at the same time the limit between a layer stack grown in monocrystalline mode on the collector region 20 and comprising a buffer layer 140, a base layer 141 and a cover layer 142 and the silicon deposited in polycrystalline mode on the STI region would be displaced in the direction of the emitter 160. Accordingly the front of the dopant which diffuses out of the polysilicon 130 would also be displaced in the direction of the SIC region 133. Admittedly that procedure reduced the area of the horizontally extending part of the space charge zone between the base layer 141 and the collector region and consequently the associated capacitance contribution. Optimised arrangements in accordance with the state of the art however will not reap any benefit from that procedure because on the one hand the total capacitance could increase due to the increase in other components of the base-collector capacitance or because on the other hand the risk in respect of crystal defects in the inner transistor region could unacceptably rise. The last-mentioned disadvantage arises in particular due to the direction of growth of the crystal imperfections at the transition from the monocrystalline to polycrystalline semiconductor material during the differential epitaxy and due to indirect adjustment of the emitter relative to the collector region.

To sum up the following first aspect is emphasised in relation to the foregoing criticism in relation to the state of the art: both in the single and also the double polysilicon technology, there is no obvious possible way, due to the structure involved, of further minimising the base-collector capacitance by a variation in collector width without other properties which are necessary for best high-speed characteristics being considerably adversely affected.

Furthermore the known transistor arrangements shown in FIGS. 1 and 2 exhibit a second aspect which is open to criticism: the parts of the base connection, which are on the insulator region, comprise polycrystalline material, whereby contact and feed lead resistances are perceptibly increased in comparison with values for monocrystalline material.

DISCLOSURE OF INVENTION

The underlying technical object of the invention is therefore that of providing a vertical heterobipolar transistor with which improved properties for high-speed applications are achieved.

A further technical object of the invention is to provide a process for the production of a heterobipolar transistor with which the described disadvantages of known processes can be avoided in particular in regard to parasitic capacitances and resistances.

Those objects are attained by a vertical bipolar transistor as in the invention, comprising a substrate of semiconductor material of a first conductivity type and an insulation region provided therein, a first semiconductor electrode arranged in an opening in the insulation region and comprising monocrystalline semiconductor material of a second conductivity type which is either in the form of a collector or an emitter and which has a first heightwise portion which is enclosed by the insulation region in lateral directions perpendicular to a heightwise direction and has an adjoining second heightwise portion which is further away from the substrate interior in the heightwise direction and which is laterally not enclosed by the insulation region, a second semiconductor electrode of semiconductor material of the second conductivity type which is in the form of the other type of semiconductor electrode and is thus for example in the form of an emitter or alternatively a collector respectively, a base of monocrystalline semiconductor material of the first conductivity type between the collector and the emitter, and a base connection region which has a monocrystalline portion which in a lateral direction laterally surrounds the base and the second heightwise portion of the first semiconductor electrode, that is further towards the substrate interior as viewed from the base, and which with its underside facing towards the substrate interior is disposed directly on the insulation region and which is referred to hereinafter as a vertically insulated monocrystalline base connection region portion, for brevity a VIMBCR portion, wherein the lateral extent of a heightwise portion of the VIMBCR portion which laterally surrounds the second heightwise portion of the second semiconductor electrode is greater than the spacing measured in the heightwise direction between an upper edge of the insulation region and a lower edge of the base.

The vertical heterobipolar transistor as in the invention, referred to also for brevity hereinafter as a bipolar transistor, transistor or HBT, is distinguished by particularly good high frequency properties. They are achieved by a particularly low parasitic base-collector capacitance which, by virtue of the structure of the bipolar transistor according to the invention, involves a reduced resistance in respect of the base connection region.

The bipolar transistor according to the invention has a low parasitic base-collector capacitance by virtue of the configuration of its base connection region. An aspect of great significance in terms of those advantageous properties is the vertically insulated monocrystalline base connection region portion, referred to for brevity as the VIMBCR portion (also referred to in English as the vertically isolated monocrystalline outer base (VIMOB) region). This involves a part of the base connection region (BCR) which rests with its underside facing towards the substrate interior directly on the insulation region of the bipolar transistor and for that reason is referred to as a vertically insulated BCR.

What is essential for reducing the resistance is that the VIMBCR portion represents an additional conductive region which further reduces the resistance of the base connection region. The VIMBCR portion additionally permits a flow of current to the base from below, which overall produces a resistance in respect of the base connection region and thus the base region, which is reduced in relation to known solutions with a low level of parasitic base-collector capacitance.

The VIMBCR portion further laterally surrounds the second heightwise portion of the first semiconductor electrode. That, in conjunction with the vertical insulation towards the collector, reduces parasitic base-collector capacitances. In an embodiment the VIMBCR portion laterally directly encloses the second heightwise portion of the first semiconductor electrode (see Example 1 hereinafter). In another embodiment it surrounds the second heightwise portion, in which case a narrow lateral portion of the base connection region with crystal defects is between the second heightwise portion and the VIMBCR portion, due to the process involved (see Example 3 hereinafter).

The boundary of the first heightwise portion of the first semiconductor electrode in the heightwise direction towards the substrate interior is defined by the extent of the insulation region towards the substrate interior. The first semiconductor electrode can also extend beyond that boundary towards the substrate interior beneath the insulation region without therefore being laterally enclosed thereby.

The term monocrystalline is used here to denote portions which have a uniform crystallographic orientation which either is predetermined by the substrate or corresponds to one of the other highly symmetrical surface orientations, in the case of silicon the surface orientations 100, 110, 111 or 311. In contrast thereto the term polycrystalline regions is used to denote those regions which comprise a plurality of crystallites involving various crystallographic orientations, which adjoin each other at the grain boundaries and which can involve extents of some nanometers to some hundred nanometers.

In the case of the vertical heterobipolar transistor according to the invention the lateral extent of that heightwise portion of the VIMBCR portion, which laterally surrounds the second heightwise portion of the first semiconductor electrode, is greater than the distance, measured in the heightwise direction, between an upper edge of the insulation region and a lower edge of the base. The geometrical arrangement of the base-collector junction of a heterobipolar transistor is optimised for very high-speed applications in that manner.

It will be noted that a vertical homobipolar transistor without heterojunctions is known from DE 39 01 881 A1. The bipolar transistor of DE 39 01 881 A1 is therefore not a heterobipolar transistor but a homobipolar transistor (homo-BJT). With the purpose of achieving an improvement in the high-speed properties of such a homobipolar transistor, that document proposes that the vertical extent of a base connection region laterally adjoining the base is such that a so-called base widening region is completely enclosed even in the high-current case (defined there by the maximum base-emitter voltage in an operating situation) by the high doping of the base connection region.

To explain the effect of base widening: if, in the case of an npn transistor (both in relation to a homo-BJT and also in relation to an HBT), the electron density in the collector zone exceeds the impurity concentration, that entails an increase in base width. That is referred to by the men skilled in the art as the base push-out effect, the Kirk effect or also the base widening effect. The term base widening is also used in that respect in DE 39 01 881 A1.

In the case of a bipolar transistor with a heterojunction at the collector side, which is practically always the situation for example with an SiGe heterobipolar transistor, drastic speed disadvantages are incurred because of the heterojunction or heterojunctions, with the onset of the Kirk effect. The reaction capability of the transistor is reduced with the onset of that effect. In the case of homobipolar transistors like that of DE 39 01 881A1 however a widening of the base in the high-current situation does not entail the speed-reducing effect as occurs in the case of hetero-and double-heterobipolar transistors.

Further development in high-speed bipolar transistors after the publication of DE 39 01 881 A1 however involved changes which cast doubt on the applicability of the technical teaching of that document. That is explained hereinafter.

It will be seen from FIG. 4 in document 1 that the base width in accordance with the state of the art at that time is about 100 nm. It can also be seen from that view that in the high-current situation the 'base widening' can assume lengths of 300 nm. That would correspond to the thickness of the lowly doped collector zone.

In terms of homobipolar transistors the development in the meantime was in the direction of smaller base widths and higher levels of doping concentration in the more lowly doped collector portion, and thus also smaller lengths in terms of 'base widening'. About half the values of the above-specified lengths (about 50 nm base width and about 150 nm lowly doped collector) were typical.

The increased dopant concentration in the collector however increased the influence of the collector-base capacitance (CBC) on the high-speed characteristics and displaced the onset of the Kirk effect towards higher current densities. For those reasons alone measures for simultaneously reducing the CBC and the base connection resistance are inevitably increasingly sought in the case of a homo-BJT.

If the technical teaching of DE 39 01 881 A1 were followed further, the vertical extent of the base connection region which in fact is said to enclose the base widening region would have to be set at least at 150 nm. That however is not done in the further development because of the increased influence of the CBC. Rather the contrary has occurred. Double poly-constructions like that of above-described FIG. 1 used an at best slight enclosure but in most cases no enclosure at all.

That also applies to an even greater degree to heterobipolar transistors. With heterobipolar transistors, in particular SiGe heterobipolar transistors, the enormous high-speed advances achieved in the meantime involved a further great reduction in base width to values of <30 through 10 nm and an increase in the base-collector doping. The latter results in widths of the base-collector space charge zone around or below 70 nm.

In the case of an HBT moreover, due to the Kirk effect, a widening of the base by a few nm (such as somewhat less than between 5 and 10 nm) is already unacceptable. A marked enlargement in the outer base zone as a lateral enclosure of the collector, as was recommended in DE 39 01 881 A1as an advance over the state of the art at that time, is not advantageous in the case of the HBT, in particular for very high-speed transistors, in the illustrated fashion, but rather is harmful because the capacitance in relation to the collector is substantially increased. In the case of a heterobipolar transistor the technical teaching of DE 39 01 881 therefore does not lead to an improvement in the high-speed properties but a worsening. By virtue of the fact however that, with the heterobipolar transistor according to the invention, the lateral extent of the heightwise portion of the VIMBCR portion which laterally surrounds the second heightwise portion of the first semiconductor electrode is greater than the spacing, measured in the heightwise direction, between an upper edge of the insulation region and a lower edge of the base, it is possible, besides the low resistance of the base connection region which is achieved in accordance with the invention, at the same time to set a substantially lower base-collector capacitance, which makes it possible to produce heterobipolar transistors affording particularly good high frequency properties.

Preferred embodiments by way of example of the transistor according to the invention are described hereinafter.

In an embodiment that heightwise portion of the VIMBCR portion which laterally surrounds the second heightwise portion of the first semiconductor electrode rests on the insulation region over a lateral extent of at least 10 nm.

In another embodiment that lateral extent is even at least 30 nm and further preferably at least 70 nm. In these embodiments the monocrystalline region is particularly wide and thus a particularly low resistance is achieved. In another embodiment the VIMBCR portion which laterally surrounds the second heightwise portion of the first semiconductor electrode rests on the insulation region over the entire lateral extent of the base connection region so that even the entire base connection region can be of a monocrystalline nature and thus of particularly low resistance.

In a further embodiment the relationship between the lateral extent of the heightwise portion of the VIMBCR portion which laterally surrounds the second heightwise portion of the first semiconductor electrode and the spacing, measured in the heightwise direction, between the upper edge of the insulation region and the lower edge of the base, is between more than 1 and 10.

The heightwise extent of the heightwise portion of the VIMBCR portion which laterally surrounds the second heightwise portion of the first semiconductor electrode is preferably between 5 nm and 100 nm. A range of between 20 nm and 50 nm is particularly preferred.

A polycrystalline lateral portion of the base connection region can adjoin the VIMBCR portion on its side remote from the base.

In another embodiment, the VIMBCR portion, by virtue of a special production process (see Example 4 hereinafter) adjoins at the base side a laterally very narrow region provided with one-dimensional or multi-dimensional dislocations or lattice mismatches.

In an alternative embodiment (see Example 1 hereinafter), on its side towards the inner transistor region, in a lateral direction, the VIMBCR portion adjoins the first semiconductor electrode without one-dimensional or multi-dimensional dislocations or lattice mismatches.

The insulation region is preferably an insulation region which is arranged in an opening in a field insulation region and which is also referred to hereinafter as a 2nd type insulation region.

The heightwise extent of the insulation region is preferably in the region of between 10 nm and 250 nm, measured from the original substrate surface. The insulation region is therefore a shallow insulation region which preferably even extends into the substrate less deeply than the field insulation regions.

In a preferred embodiment the insulation region has a pit filled with the material of the base connection region. The provision of a pit affords the advantage that dopant can also penetrate out of the highly doped, polycrystalline part of the base connection region from the substrate side in the direction of the base, that is to say the inner base region.

In another embodiment as viewed in cross-section the first heightwise portion of the first semiconductor electrode narrows towards the second heightwise portion. Such a structure improves the high frequency properties by virtue of a reduction in the collector resistance and by increased heat dissipation. The side wall of the insulator region can also be stepped or curved, with the width of the collector increasing towards the substrate. The advantages of this embodiment are further described hereinafter with reference to FIG. 3.

It is preferred that, as viewed in cross-section, the minimum lateral extent of the narrowing first heightwise portion of the first semiconductor electrode is of the same size as or smaller than the maximum lateral extent of the second semiconductor electrode.

In that embodiment reverse operation of the bipolar transistor according to the invention is possible. For that purpose, the first semiconductor electrode is in the form of the emitter and the second semiconductor electrode is in the form of the collector, by suitably adapted dopant concentrations.

The case which is preferred however in the present situation is that of forward operation in which the first semiconductor electrode is in the form of the collector and the second semiconductor electrode is in the form of the emitter.

In a further embodiment a buffer layer of monocrystalline semiconductor material is arranged between the second heightwise portion of the first semiconductor electrode and the base. It will be appreciated however that the buffer layer can also be omitted.

In a further embodiment a cover layer of monocrystalline semiconductor material is arranged between the base and the second semiconductor electrode.

The emitter, generally the second semiconductor electrode, is preferably T-shaped as is known per se.

The vertical bipolar transistor structure of the invention can also be produced on an SOI substrate, as is described in greater detail hereinafter with reference to Examples 3 and 4.

In this embodiment the lateral portion of the base connection region, which lateral portion is defective as viewed crystallographically, is laterally delimited and on its side remote from the base adjoins the monocrystalline portion of the VIMBCR portion.

The configuration of the side wall of the insulator region adjoining the first semiconductor electrode can extend perpendicularly or approximately perpendicularly to the substrate surface. In a further configuration the inner side wall of the insulator region has a slope, whereby the width of the collector region increases towards the substrate. Such a structure improves the high frequency properties by virtue of a reduction in the collector resistance and by increased heat dissipation. The side wall of the insulator region can also be stepped or curved, with the width of the collector increasing towards the substrate.

In a further configuration of the semiconductor arrangement according to the invention, material properties which influence the shape of the side wall of the insulator region adjoining the collector are deliberately set in the collector. In preferred embodiments that includes setting of dopant profiles or the introduction of heterolayers which control etchability. Thus in the first heightwise portion or in the second heightwise portion the first semiconductor electrode can include a plurality of layers of different material composition, for example SiGe layers with a Ge content of differing magnitude, or a plurality of layer portions with a dopant concentration of differing magnitude. A more detailed discussion of the advantages of this embodiment is set forth hereinafter with reference to the specific description.

In a further configuration of the bipolar transistor according to the invention the width of the collector, at the base side, can be less than the width of the emitter window. In that way advantageous high frequency properties can be achieved simultaneously in the forward mode of operation and in the reverse mode of operation (the collector takes over the function of the emitter and vice-versa) of the vertical bipolar transistor.

The dielectrically insulated, monocrystalline base connection region of the bipolar transistor according to the invention can also be on the oxide layer of an SOI (silicon on insulator) substrate wafer. In that case, intermediate spaces are provided in the oxide layer of the SOI substrate wafer and, filled with semiconductor material, serve as a collector region. In that case the base connection region can almost completely consist of monocrystalline semiconductor material. The side wall of the oxide layer, adjoining the collector region, can be of such a configuration relative to the substrate that the collector region is widened.

The device according to the invention can also be produced without detriment on SOI substrates with very thin Si cover layers which in particular are of layer thicknesses of less than 50 nm. In particular the heat dissipation which is worsened in known arrangements by virtue of buried oxide layers is eliminated. The increase in the thickness of the Si cover layers during the production of epitaxially buried collectors also does not occur with the device according to the invention. Therefore the device according to the invention can be easily combined with the so-called 'fully depleted' or 'partially depleted' MOS transistors.

The semiconductor device according to the invention can involve in particular a vertical bipolar transistor with epitaxial or implanted base.

In accordance with the invention two alternatives of the heterobipolar transistor according to the invention are proposed. A first alternative for the production of the heterobipolar transistor according to the invention concerns production on a high-ohmic monocrystalline substrate and involves the following steps:

a) providing a high-ohmic monocrystalline semiconductor substrate 210 of a first conductivity type having a first heightwise portion of a first semiconductor electrode region 224 of a second conductivity type, b) producing a monocrystalline island-form pedestal layer 225 over the first heightwise portion of the first semiconductor electrode region 224, c) producing a trench around the island-form pedestal layer 225 such that the pedestal layer 225 finally rests on a support base region 220 of the first heightwise portion of the first semiconductor electrode region and projects laterally beyond the support base region, d) filling the trench with insulator material to produce an insulation region 212, e) differentially epitaxial deposit of a layer stack over the island-form pedestal layer with a monocrystalline base layer, f) forming a base region and a base connection region by doping of the layer stack and forming a second heightwise portion of the first semiconductor electrode, which is restricted in the lateral direction to the lateral extent of the support base region, in such a way that the base connection region 233; 320 has a monocrystalline portion 233a, 233b, 233c, 233d, 233e which laterally surrounds in the lateral direction the base and the second heightwise portion 230a of the first semiconductor electrode 220; 326, which is further towards the substrate interior as viewed from the base, and which rests with its underside facing towards the substrate interior directly on the insulation region 212; 327 and which is referred to hereinafter as the vertically insulated monocrystalline base connection region portion, for brevity the VIMBCR portion, and g) forming a second semiconductor electrode of the second conductivity type.

In order to further describe the advantages of this alternative of the process according to the invention reference is made on the one hand to the description of the advantages of the heterobipolar transistor according to the invention and on the other hand to the detailed description of an embodiment by way of example of the process in the form of Example 2 hereinafter.

Further preferred embodiments by way of example of the process according to the invention are described hereinafter.

In an embodiment the step of providing a high-ohmic monocrystalline semiconductor substrate of a first conductivity type with a first heightwise portion of a first semiconductor electrode region of a second conductivity type includes the following sub-steps:

a1) producing at least one field insulation region having an opening which contains monocrystalline semiconductor material, and a2) conductivity doping to produce semiconductor material of a second conductivity type for a first semiconductor electrode in the opening.

In a further embodiment formed in the insulation region prior to the deposit of the base layer stack is a pit which laterally adjoins the island-form pedestal layer and which in the subsequent deposit of the base layer stack is filled and becomes part of the base connection region. This embodiment is described in greater detail hereinafter in the description of Example 2.

An alternative process according to the invention for the production of a vertical heterobipolar transistor concerns the use of a substrate having a buried insulator layer such as for example an SOI substrate, and comprises the following steps:

a) providing a high-ohmic monocrystalline semiconductor substrate of a first conductivity type with a buried insulator layer, b) producing openings in the insulator layer buried in the semiconductor substrate, c) filling the openings with monocrystalline semiconductor material and doping the semiconductor material in the region of the openings and in parts of the subjacent Si substrate for producing a first heightwise portion and a second heightwise portion disposed thereabove of a first semiconductor electrode region of a second conductivity type, d) depositing a base layer stack which is either overall monocrystalline or which has a laterally delimited polycrystalline lateral portion extending in the heightwise direction from the top side of the buried insulator layer to the top side of the base layer stack, e) producing an emitter window in the base layer stack, the opening of which extends over a lateral portion of the base layer stack, which is smaller than the opening of the insulator layer, f) producing a base of the first conductivity type by doping of the base layer stack in a region laterally delimited by the opening of the emitter window, and producing a base connection region by doping of the base layer stack outside the emitter window, and g) producing an emitter.

By virtue of the depicted production procedure of this alternative process it is possible to avoid crystal imperfections at the transition from the collector region to the collector pedestal, in particular in the overhanging Si regions. On the basis of that process, it is provided that the width of the collector region, at the base side, for a given, established emitter width, can be varied within markedly wider limits than in comparison with the state of the art without restrictions having to be feared due to an increase in the base-collector edge capacitance or the danger of crystal defects in the emitter region. The base connection region is disposed at least portion-wise over the insulator region and there at least in part has portions of monocrystalline semiconductor material. Those portions of the base connection region are further referred to as the dielectrically insulated, monocrystalline base connection region.

BRIEF DESCRIPTION OF THE DRAWINGS

Further features and advantages of the invention will be apparent from the description hereinafter of embodiments by way of example with reference to the Figures in which.

DETAILED DESCRIPTION

Four Examples are described hereinafter with reference to the respectively stated Figures.

Example 1

Figure 3:
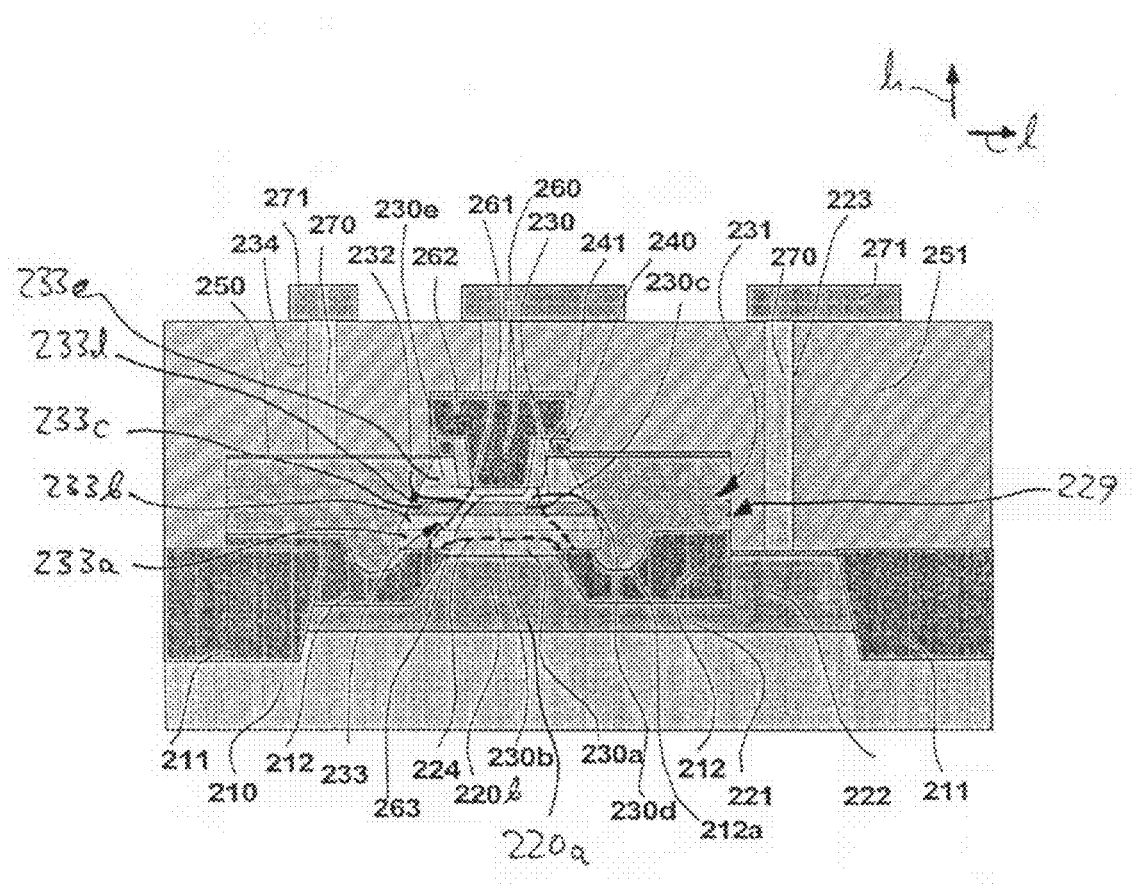
FIG. 3 shows a cross-sectional view of a first embodiment of a vertical bipolar transistor according to the invention.

A first embodiment of a semiconductor device according to the invention with a vertical bipolar transistor which has a dielectrically insulated, partially monocrystalline base connection region, will now be described with reference to FIG. 3. FIG. 3 shows a cross-sectional view of this first embodiment.

In this example a vertical npn bipolar transistor is produced on a high-ohmic, monocrystalline, $p^-$-conductive Si substrate 210. The arrangement described here however is not limited to $p^-$-conductive Si substrates. The essential features can also be transferred to substrates of the opposite conductivity type. In addition CMOS transistors can be produced on the substrate 210 at the same time, but they are not shown in FIG. 3.

The vertical npn bipolar transistor of FIG. 3 includes an n-conducting collector 220 and an also n-conducting emitter 260. The collector is laterally connected by way of a collector connection region 221 and a collector contact region 222 to a collector contact 223.

Arranged between the emitter 260 and the collector 220 is a layer stack 229 which in an inner region 230 is monocrystalline and which is extended laterally outwardly in the form of a polycrystalline layer stack 231. The layer stack 229 includes a p-conducting base layer 230c in its inner region 230. An inner base layer 232 is defined as a portion of the base layer 230c in a horizontal direction approximately by the width of the emitter window 261. The inner base layer 232 is laterally connected by way of the base connection region 233 to the base contact 234. The base connection region 233 is composed of a monocrystalline region of the layer stack 230 and the further outwardly disposed region of the polycrystalline stack 231.

The monocrystalline layer stack 230 is produced in three epitaxy steps. The layer stack 230 is composed of five layers 230a-230e described hereinafter.

Disposed over the collector 220 is a monocrystalline Si layer 230a which is produced in a first epitaxy step. It can be of a thickness of between 5 nm and 100 nm, preferably between 20 nm and 50 nm.

The layers 230b-d are produced in a second epitaxy step. A buffer layer 230b is firstly produced by differential growth. That layer can be between 5 nm and 70 nm in thickness, preferably between 5 nm and 50nm in thickness.

The p-doped base layer 230c is produced above the buffer layer. The thickness of the base layer can be between 1 nm and 100 nm, preferably between 2 nm and 35 nm.

Over the base layer there then follows a cap layer 230d which is between 10 nm and 100 nm, preferably between 10 nm and 50 nm, in thickness.

A monocrystalline portion of a base connection reinforcement 230e is produced in a third epitaxy step laterally of the emitter and above the cap layer 230d. The layer thickness produced in the vertical direction can be between about 20 nm and 150 nm, preferably between 50 nm and 120 nm.

A first kind of insulation regions 211, referred to hereinafter as field insulation regions, projects into the substrate interior. So-called 'shallow trench' insulations, as are known from CMOS technologies, can be used as the field insulation regions. These involve trenches which are preferably between 250 and 600 nm in depth and which can be filled for example with silicon dioxide ($SiO_2$) but also with a combination of insulator material and polysilicon. Alternatively it is also possible to use field insulation regions produced by means of local oxidation (LOCOS). In addition to the shallow field insulation regions it is also possible to use deep trenches which are filled for example with SiO$_2$ but which are not provided in the arrangement shown in FIG. 3.

A second kind of insulation regions 212 which are briefly referred to in the claims as insulation regions is distinguished in relation to the field insulation regions in that the bottom, which is buried in the substrate, of the insulation regions of the second kind, at a depth of between 10 nm and 200 nm, does not reach the lower edge of the field insulation regions 211. The insulation regions of the second kind preferably comprise an insulator material with a low dielectric constant. It is possible for that purpose to use silicon dioxide (SiO$_2$) but also another, so-called low-k material. In the example in FIG. 3 the insulation region of the second kind as indicated at 211 comprises two sub-regions. One of those laterally adjoins the field insulation region 211 and partially covers it over. It is however also possible, without substantial effects on the desired function, for the insulation region 212 of the second kind not to have any overlap with the field insulation region 211 and for the upper edge of the insulation region 212 of the second kind even to be deeper than that of the field insulation region 211. The second insulation region 212 of the second kind is disposed completely on the substrate region. The insulation regions 212 of the second kind are provided with etching pits 212a in the lateral environment of the monocrystalline Si layer 230a.

Arranged between the insulation regions 212 of the second kind at the substrate surface are islands of monocrystalline silicon regions in which the vertical npn bipolar transistor is arranged. It includes a collector 220 which is in the substrate and which is laterally defined in the lower part by the side walls of the field insulation regions 211 and further upwardly by the insulation regions 212 of the second kind. By virtue of dopant diffusing out in the course of the production procedure, the base-side front of the collector doping, as indicated by a broken line 224, can be displaced into the epitaxially produced Si region 230a.

The base connection region 233 which widens inclinedly outwardly from the inner base region 232 has a monocrystalline portion 233a through 233e on the insulation regions 212 of the second kind. The production process ensures that there are no crystal imperfections in the transitional region from the collector 220 to the base connection region 233, whereby it is possible to ensure good control of diffusion of the dopants out of the base connection region and the collector.

The provision of an etching pit 212a affords the advantage that dopant can also penetrate out of the highly doped, polycrystalline part of the base connection region 233, from the substrate side in the direction of the inner base region 232.

The base 230c can preferably be introduced into an alloy of SiGe. In addition, carbon can be incorporated during the epitaxy procedure in the buffer layers 230a, b or in the base layer 230c or in the cap layer.

Disposed above the layer stack 230, 231 is a structured insulator layer 240. It can preferably comprise an SiO$_2$ layer which is between 10 nm and 150 nm and preferably between 30 nm and 120 nm in thickness. It can however also be composed of a combination of various insulator materials. A spacer 241 comprising insulation material ensures electrical insulation of the emitter 260 from the base connection region 233.

The opening formed by the spacers 241 over the layer stack 230 defines the emitter window 261. A highly doped silicon layer of the conductivity type of the collector, the npn emitter layer 262, covers the emitter window 261 as well as the insulator layer 240. The npn emitter layer 262 can be deposited in the form of a polycrystalline, amorphous, partially monocrystalline, partially crystalline or monocrystalline material. During a high temperature step n-dopant can be diffused out of the highly doped npn emitter layer 262 into the layer stack 230 through the emitter window 261. In that case the emitter 260 includes the npn emitter layer 262 and the n-region 263 which has diffused in.

In a following siliconisation step the silicide layers 250 which are even better conductive in comparison with highly doped Si are produced. The surface of the transistor and insulation regions is covered with an insulator layer or insulator layer combination 251. Contact holes 270 filled with conductive material and metal strips 271 disposed thereover produce the electrical connection to the contact regions of the transistor.

Example 2

Reference is now made to FIGS. 4 through 9 to describe a process for the production of the semiconductor device according to the invention, comprising a vertical bipolar transistor with a dielectrically insulated, partially monocrystalline base connection region.

Figure 4:
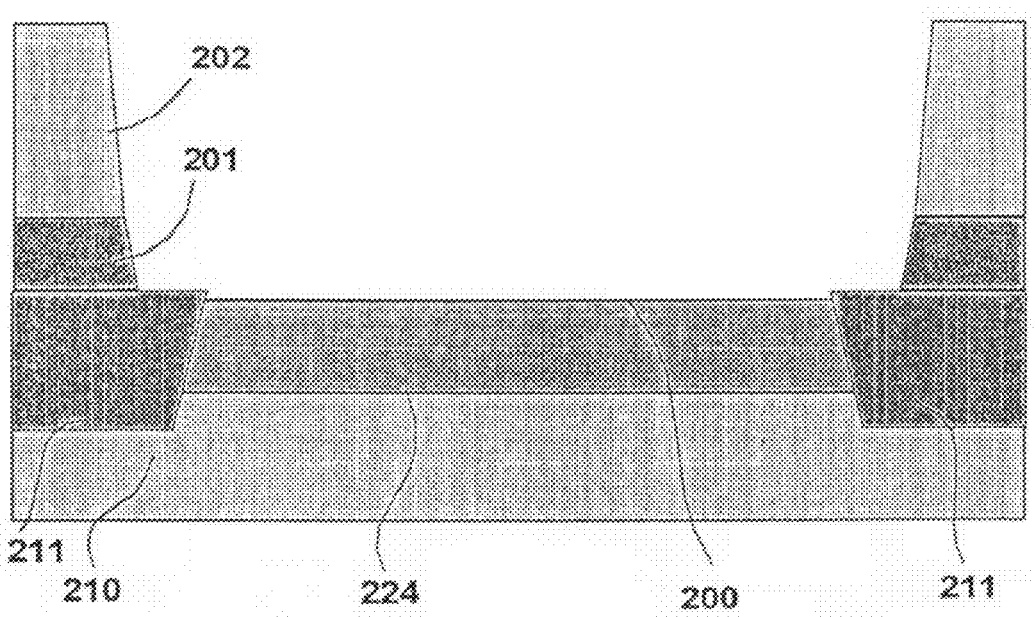
FIG. 4 shows a cross-section of the vertical bipolar transistor according to the invention during production.

FIG. 4 shows a snapshot during a first masking step for manufacture of the vertical bipolar transistor. The basis for production is formed by a substrate 210 (FIG. 4) which preferably includes a monocrystalline p$^-$-conducting (slight p-conducting doping) silicon which is as highly resistive as possible. The working procedure in respect of the substrate 210 begins with the production of the field insulation regions 211. In the present Example so-called shallow trenches are used as the field insulation regions. Islands of Si regions, which are produced between the field insulation regions, form active regions. After production of the vertical bipolar transistor the active region 200 will accommodate the collector, the collector connection and the collector contact region.

The further operating procedure is continued with the deposit of an Si$_3$N$_4$ layer 201. That layer later serves as a stop layer during a CMP step. Demands in terms of the thickness of the layer will be apparent from the description hereinafter.

By means of a lacquer mask 205 and conventional anisotropic dry etching procedures the layer 201 is opened over the active region 200 and in overlapping relationship on the field insulation regions 211. It is however also possible, in place of the layer 201, to deposit a layer stack and, in the presence of a lacquer mask, by means of dry or wet etching, to remove a cover layer of the layer stack and, after lacquer removal, the subjacent layer, selectively in relation to the remaining layers, using wet-chemical processes. During that step in the procedure an n-doping 224 is introduced into the active region 200 by implantation. Implantation of the n-doping 224 can be effected prior to the removal of the lacquer mask 202 or subsequently thereto. The latter case is possible if the thickness of the layer 201 or a possible layer stack is sufficient to prevent unwanted implantation of other active regions.

Figure 5:
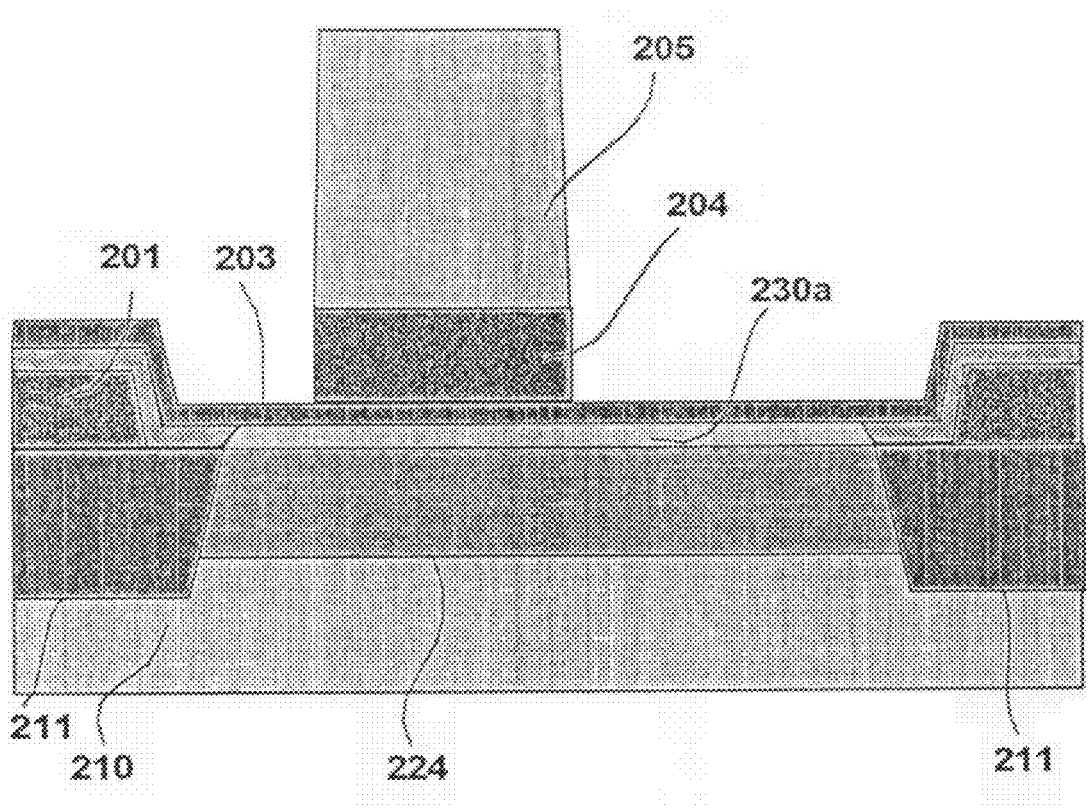
FIG. 5 shows a cross-section of the vertical bipolar transistor according to the invention during production.

After removal of the lacquer mask 202 (see FIG. 4), an epitaxy step is effected in which a monocrystalline Si layer 230a is grown on the active region 200 (see FIG. 5). At the same time polycrystalline Si is produced on the field insulation regions 211 and on the layer 201. The thickness of the Si layer 230a can be between 5 nm and 100 nm, preferably between 20 nm and 50 nm. After that a layer stack 203/204 consisting of SiO$_2$/Si$_3$N$_4$ is deposited. Known methods of dry etching are applied by means of a lacquer mask 205 which has been previously structured in accordance with conventional processes, for removal of the layer stack 203/204 from the regions which are not protected by the lacquer mask.

FIG. 5 shows a cross-section through an intermediate stage in the production process of the vertical bipolar transistor at a moment at which the etching process has already removed the Si$_3$N$_4$ layer and has reached the SiO$_2$ layer 203. In the course of removal of the layer stack 203/204 the subjacent Si buffer layer 230*a* and the polycrystalline continuation thereof on the insulator regions, outside the lateral region defined by the lacquer mask 205, is also partially or entirely removed. It is also possible for regions, near the surface, of the semiconductor material of the active region 200, outside the masked region, to be removed. The resulting overall depth of that etching depends on aspects which are related to subsequent hollowing out under the region covered by the lacquer mask 205.

Figure 6:
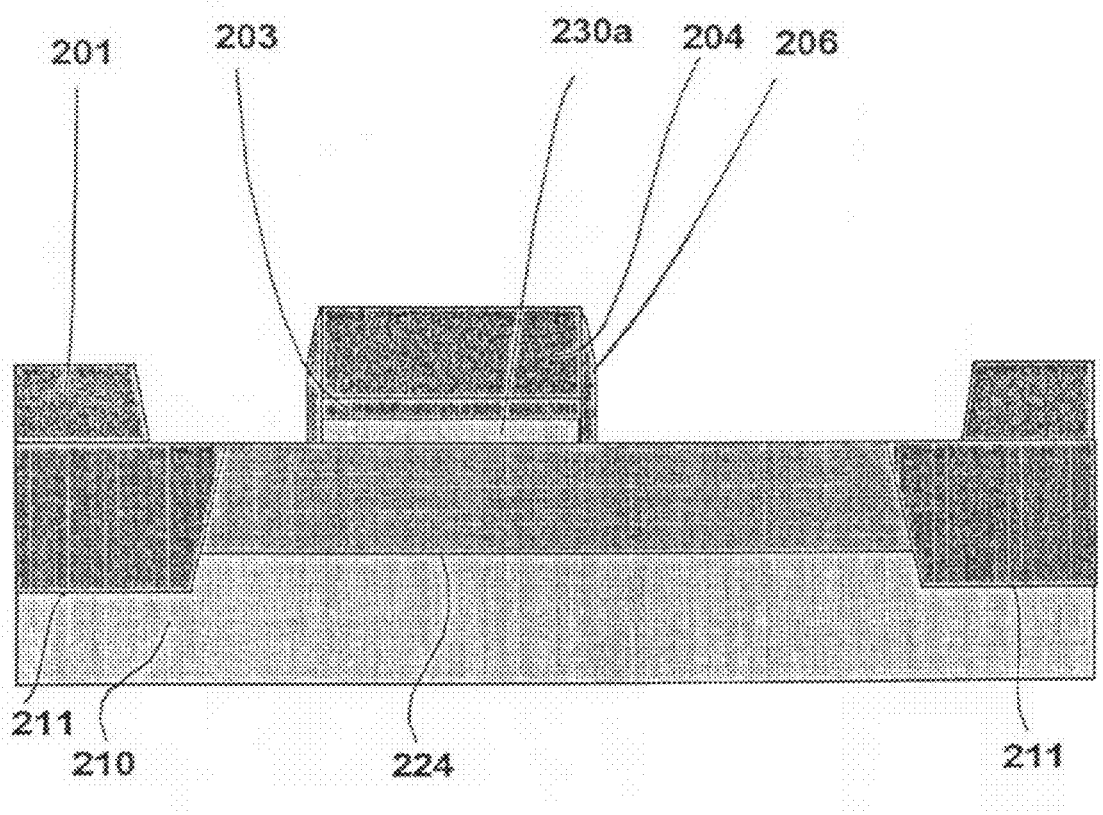
FIG. 6 shows a cross-section of the vertical bipolar transistor according to the invention during production.

In order to prepare for the hollowing-out step, after removal of the lacquer mask 205 a spacer 206 preferably consisting of Si$_3$N$_4$ is applied using conventional methods to the etched side wall of the layer structure 230*a*/203/204. The result of that process sequence is shown in FIG. 6. Si which is exposed towards the surface is removed in an etching step which now follows. In that case isotropic or anisotropic or a combination of both etching procedures can be used. The aim is to hollow out the region under the Si region covered with the layer stack 203/204, with an overhanging Si region being retained at the surface. That intention is assisted on the one hand by the spacers 206 which delay lateral etching attack. On the other hand a selectivity difference between the epitaxially grown Si-layer 230*a* and the implanted Si region 204, when using suitable etching processes, can lead to the desired aim.

The relationship of vertical and lateral etching rates can be influenced both by doping profiles and also by material alloys. Thus for example SiGe layers with a constant or variable Ge content can be produced at the substrate surface or in the layer 230*a* (not involved in this Example) in such a way that the desired form of the hollowed-out region is achieved by the high selectivity of known wet or dry etching processes (T K Carns, M O Tanner and K L Wang, 'Chemical etching of Si1-xGex in HF:H2=2:CH3COOH', J Electrochem Soc Vol 142, No 4, 1995) in respect of Si and SiGe.

Figure 7:
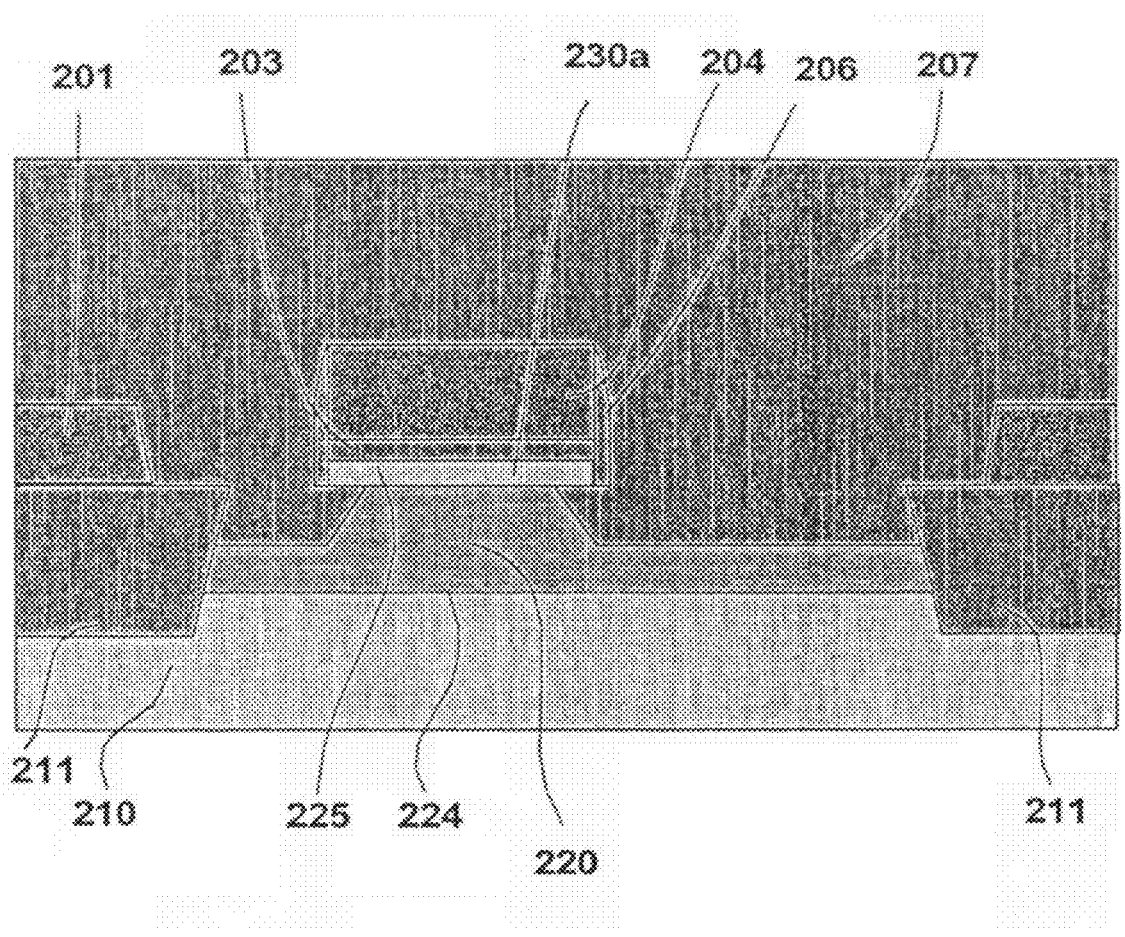
FIG. 7 shows a cross-section of the vertical bipolar transistor according to the invention during production.

An advantageous configuration of this arrangement can be found in FIG. 7. The vertical extent of the recesses last produced can be in the range of between 10 nm and 250 nm, relative to the original substrate surface, while the overhanging Si region can attain a lateral extent of between 10 nm and some 100 nm.

That monocrystalline Si region which is covered by the layer stack 203/204 in FIG. 7 will be referred to hereinafter as the collector pedestal 225.

Figure 1:
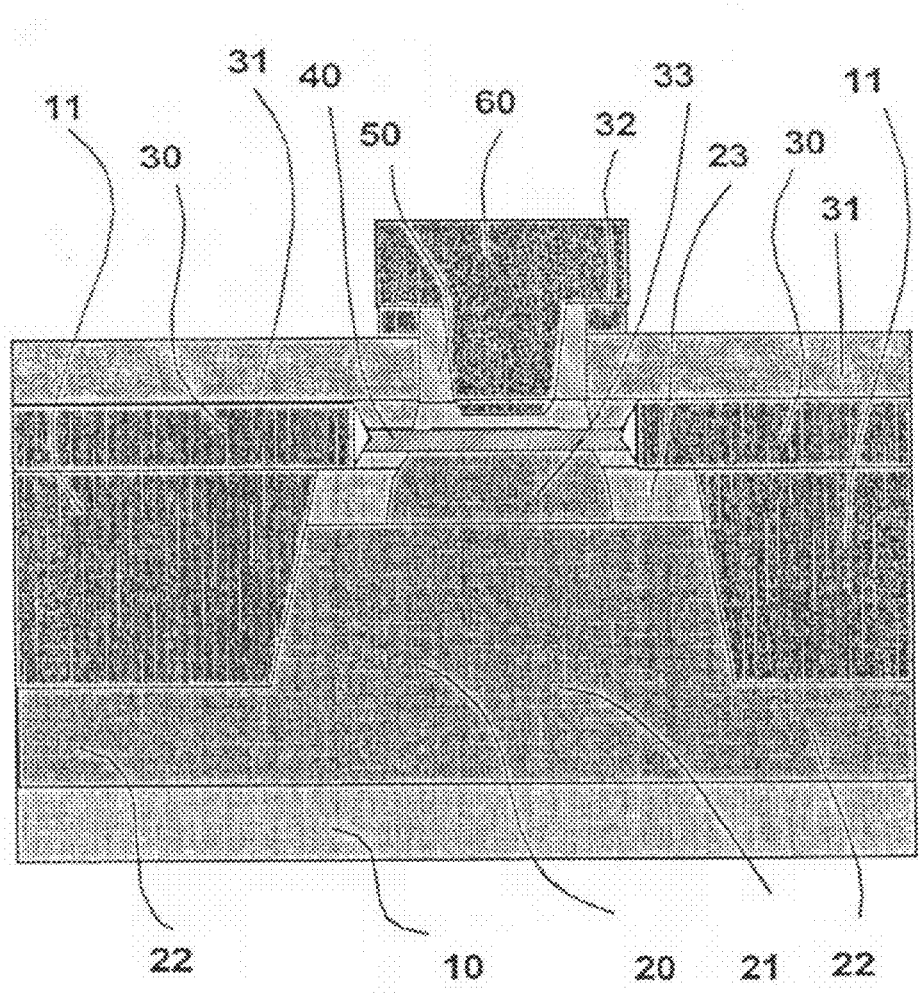
FIG. 1 shows a cross-section of a vertical bipolar transistor in accordance with the state of the art produced using double polysilicon technology.
Figure 2:
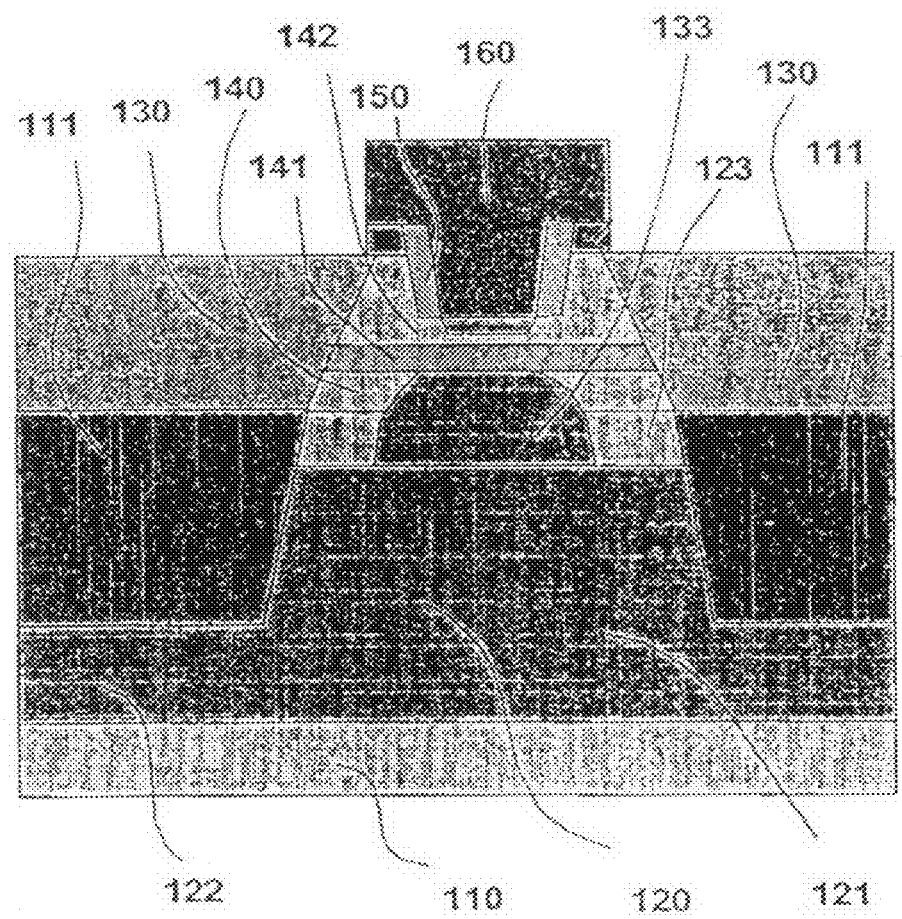
FIG. 2 shows a cross-section of a vertical bipolar transistor in accordance with the state of the art produced using single polysilicon technology.

In a horizontal direction which in the cross-sectional view in FIG. 1 is also the discernible lateral direction the collector pedestal 225 has a central region which at the substrate side adjoins the implanted Si region 224, as well as overhanging portions at the sides. The Si region which is formed between the recesses becomes part of the collector region 220.

A widening of the part of the collector region 220, which is between the recesses, is to be noted in a vertical direction towards the substrate interior. That is achieved for example by a procedure whereby, in an isotropic etching process, the lateral boundary of the etched region, which is further in the direction towards the surface, is exposed to the etching agent for a greater period of time. It is also possible to utilise the dependency of the etching rate on the dopant concentration. By virtue of a suitable selection in respect of the implantation conditions for the n-doping 224, it is possible to provide that there is a greater dopant concentration in the upper portions of the collector region 220 than in the lower portions. As explained hereinbefore, that gradient in respect of dopant concentration provides relationships which are different in dependence on depth in respect of vertical and horizontal etching rates in the etching process.

The configuration achieved in that way has an advantageous effect on collector resistance and dissipation of heat. The laterally overhanging Si-region of the collector pedestal 225 becomes a part of the base connection region, in the portion which is disposed further outwardly.

The production process depicted makes it possible to avoid crystal imperfections at the transition from the collector region 220 to the collector pedestal 225, in particular in the overhanging Si regions. On the basis of that process it is provided that the base-side width of the collector region 220, for a given, established emitter width, can be varied within markedly wider limits than in comparison with the state of the art without any fear of limitations by virtue of an increase in the base-collector edge capacitance or due to the risk of crystal defects in the emitter region.

A variant of the vertical bipolar transistor according to the invention also embraces the possibility that the minimum width of the collector region 220 is the same as the width of the emitter window or less than the width of the emitter window.

In those cases a transistor which is operated in the reverse mode and in which an emitter is disposed under the collector, that is to say further towards the substrate interior, is also a further possible design configuration. Under those circumstances the doping profiles for emitter, base and collector are to be so selected that the desired transistor properties are achieved in the reverse mode or for both modes.

As shown in FIG. 7, after production of the collector pedestal 225 the resulting recesses are filled with SiO$_2$. In addition a sufficiently thick SiO$_2$ layer 207 is deposited in order to be able to compensate for unevenness at the surface by means of a subsequent chemical-mechanical polishing (CMP) step. In that case the layer 201 serves as a stop layer during the chemical-mechanical polishing operation. The height, remaining after the polishing step, of the Si$_3$N$_4$ layer 204 above the collector pedestal or the height of the insulation regions 212, also referred to as insulation regions of the second kind, can be controlled by the height of the Si$_3$N$_4$ layer 201 (see FIG. 8).

Figure 8:
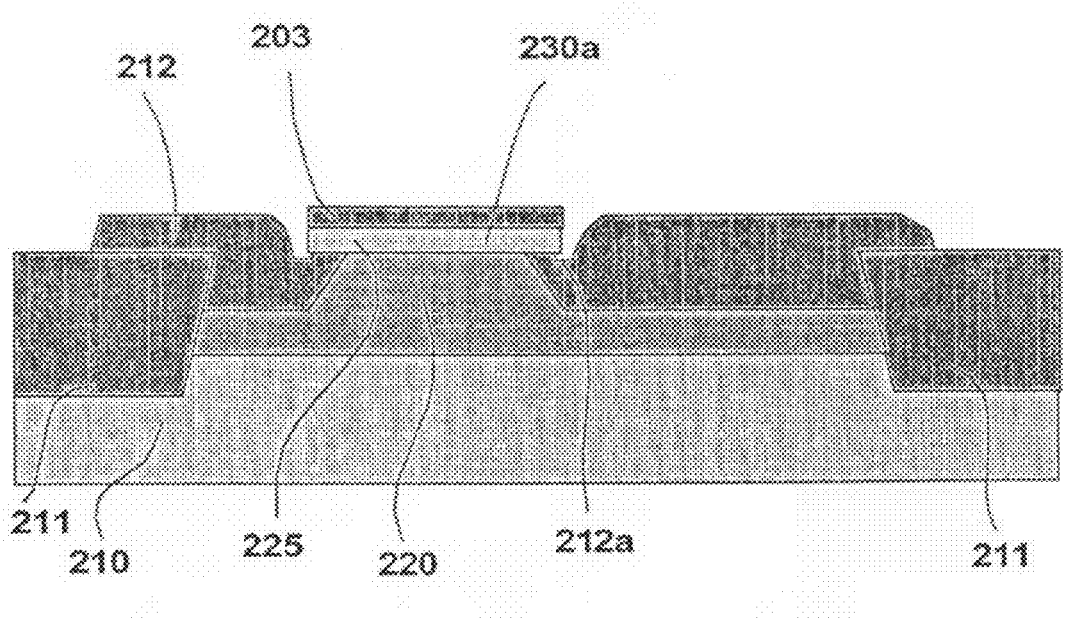
FIG. 8 shows a cross-section of the vertical bipolar transistor according to the invention during production.

FIG. 8 shows a cross-section through the vertical bipolar transistor after selective, wet-chemical removal of the Si$_3$N$_4$-layers 201, 204 and 206. By virtue of the material and the form of the spacers 206, it can be provided that the insulation regions 212 of the second kind are provided with etching pits 212*a* in the area laterally surrounding the collector pedestal 225. This embodiment which is possible but not necessary affords the advantage that dopant from the polycrystalline layer 213 can also penetrate out of the highly doped base connection region 233 which is produced later (see FIG. 3), from the substrate side in the direction of the inner base region 232. Formation of the etching pits is suppressed for example if the spacers are made from SiO$_2$.

Figure 9:
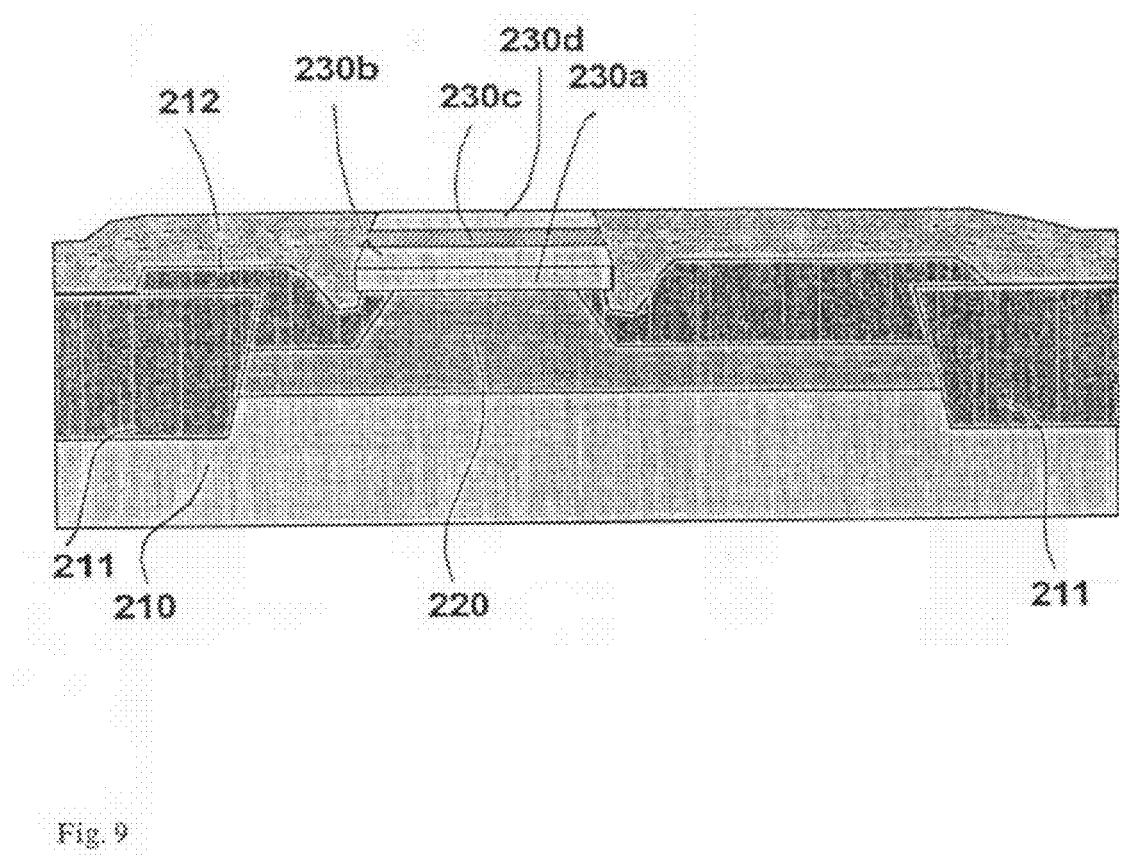
FIG. 9 shows a cross-section of the vertical bipolar transistor according to the invention during production.

FIG. 9 shows an intermediate stage in the production of the vertical bipolar transistor after epitaxial deposit of the monocrystalline layer stack 230 which is extended sideways in the form of a polycrystalline layer 231 on the insulation regions. The differential epitaxy step includes the deposit of the buffer layer 230*b*, the SiGe base layer 230*c* doped in situ with boron and the cap layer 230*d*. Instead of the base doping which is introduced in situ, the base can also be produced by implantation.

The further operating procedure for production of the vertical bipolar transistor with a dielectrically insulated, partially monocrystalline base connection region is in accordance with known methods. For that purpose the sequence of process steps set forth in IHP.253 is used for the production of an emitter construction with self-positioned base connection regions which are reinforced by means of selective epitaxy.

Example 3

Figure 10:
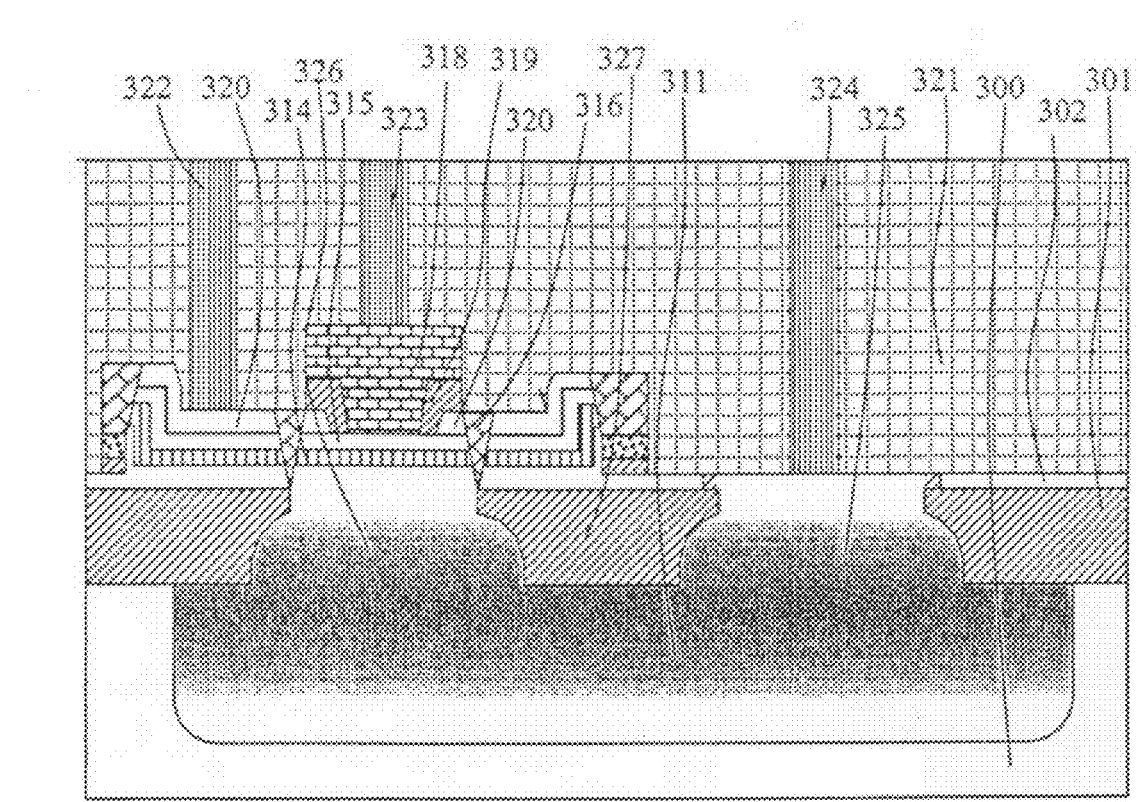
FIG. 10 shows a cross-section of the vertical bipolar transistor according to the invention on an SOI substrate wafer.

A further embodiment of a semiconductor device according to the invention will now be described with reference to FIG. 10. FIG. 10 shows a cross-sectional view of a bipolar transistor with partially monocrystalline base connection region on an SOI substrate. The SOI substrate wafer comprises a carrier substrate of silicon 300, a buried oxide layer 301 and an Si cover layer 302.

The npn transistor of this embodiment includes an n-conducting emitter 318, a p-conducting base 314 and an n-conducting collector 326. The collector is passed by way of an n-conducting collector trough 311 and an n-conducting collector connection region 325 to the collector contact 324. The buried oxide layer 301 of the SOI substrate wafer is interrupted in the collector regions 326 and in the collector connection regions 325. Those interrupted regions of the buried oxide layer are filled by epitaxially deposited monocrystalline silicon. In particular the collector regions 326 and the collector connection regions 325 can be separated from each other by a remaining part of the buried oxide layer 327 or they can be formed in a common window in the buried oxide layer. The boundary of the opened windows in the buried oxide layer can in particular be of such a nature that the size of the windows increases with increasing depth. That permits a low collector resistance to be achieved. It is also possible for the window in the buried oxide layer to be bordered by a perpendicular interface between silicon and silicon dioxide.

Arranged above the collector region 326 is an epitaxial base layer which includes a p-doping. In particular the epitaxial base layer can enclose an SiGe layer 314. By way of example the epitaxial base layer can include an Si/SiGe/Si layer sequence. In addition the epitaxial base layer can be doped with carbon. The epitaxial base layer can be particularly advantageously produced by differential epitaxy. In that case the layer grows monocrystallinely on crystalline silicon regions and polycrystallinely on regions covered with insulator layers.

The bipolar transistor according to the invention is distinguished in that the part of the base region which is dielectrically insulated from the collector 326 by the buried oxide layer 301 is partially or completely monocrystalline. Monocrystalline growth of the base layer above the buried oxide layer 301 is made possible by the silicon layer 302 disposed on the buried oxide layer. The monocrystalline structure of the base layer also in the regions which are dielectrically insulated from the collector region 326 by the buried oxide layer 301 leads to a particularly low level of electrical resistance in respect of that layer and thus improved high frequency properties for the transistor. Along the boundary of the collector region 326 the monocrystalline growth of the base layer can be disturbed in a restricted region 316.

The emitter 318 is arranged above the epitaxial base layer. The emitter comprises $n^+$-doped Si which can be monocrystalline or polycrystalline. The emitter is laterally delimited by spacers 319 comprising silicon dioxide or another insulator material. The emitter is connected by the contact 323.

Example 4

Figure 11:
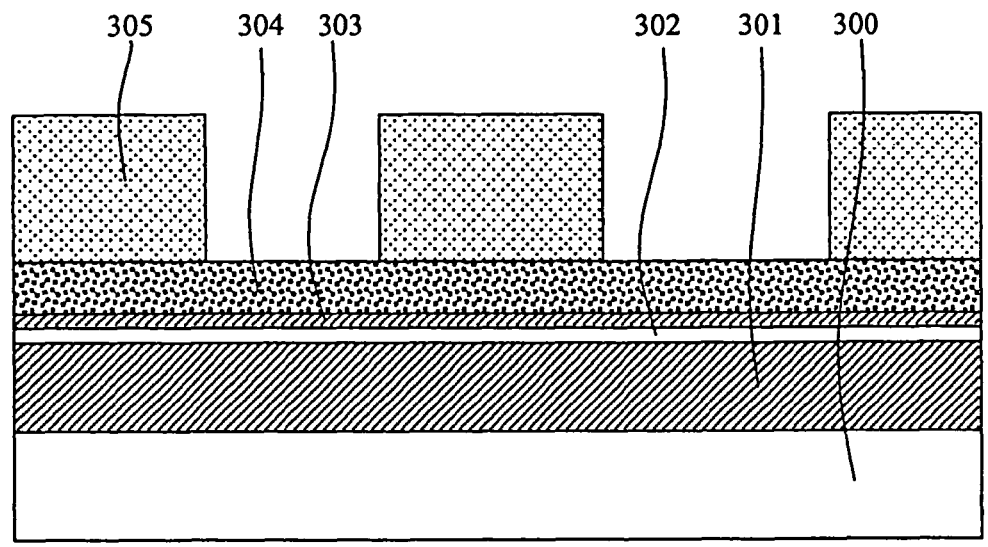
FIG. 11 shows a cross-section of the vertical bipolar transistor according to the invention during production on an SOI substrate wafer.

A preferred process for the production of the transistor illustrated in FIG. 10 is described hereinafter with reference to FIGS. 11 through 16. A silicon dioxide layer 303 is produced by thermal oxidation or by a deposition process on the SOI wafer comprising a carrier substrate of silicon 300, a buried oxide layer 301 and an Si cover layer 302. A silicon nitride layer 304 is deposited on that silicon dioxide layer (FIG. 11).

Figure 12:
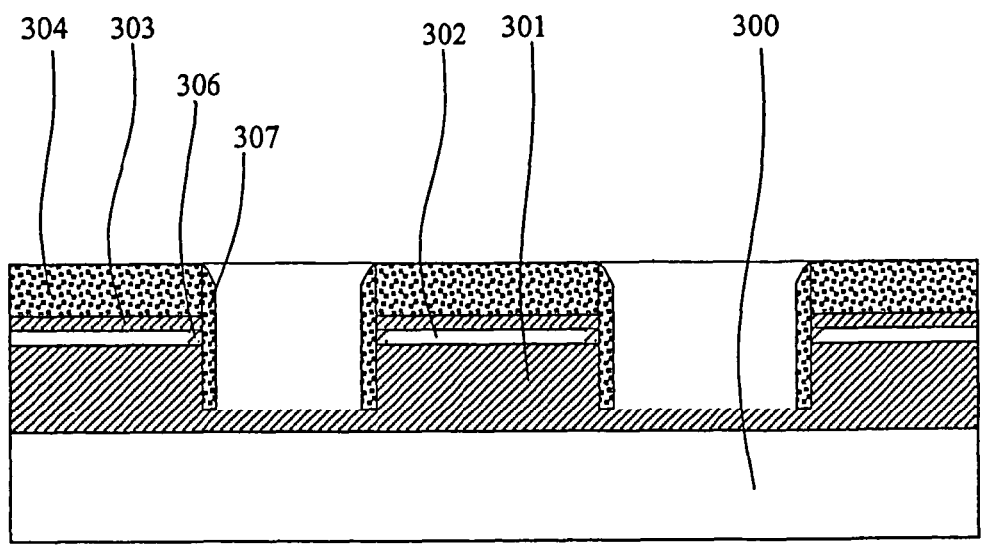
FIG. 12 shows a cross-section of the vertical bipolar transistor according to the invention during production on an SOI substrate wafer.

In further steps, the lateral extents of the collector regions 326 and collector connection regions 325 are defined by means of a lacquer mask 305. The silicon nitride layer 304, the silicon dioxide layer 303 and the Si layer 302 are removed, in the open regions, by way of a succession of RIE-processes. The buried oxide layer 301 is partially removed in those regions (FIG. 12). By way of example a further RIE-process can be used for that purpose.

In a further step the cut surfaces of the Si-layer 302, which are exposed along the boundary line of those opened windows, are covered for example by thermal oxidation with silicon dioxide 306. Spacers of silicon nitride 307 are then formed at the inside surfaces of the opened windows by means of processes corresponding to the known state of the art (FIG. 12).

In a further step the part of the buried oxide layer 301, which has remained in the regions of the opened windows, is removed for example by a wet etching process. In a preferred configuration of the process, the windows can be of a size that increases downwardly, by means of under-etching of the nitride spacers 307. The nitride layer 304 and the spacers 307 are then removed for example by means of a wet etching process.

Figure 13:
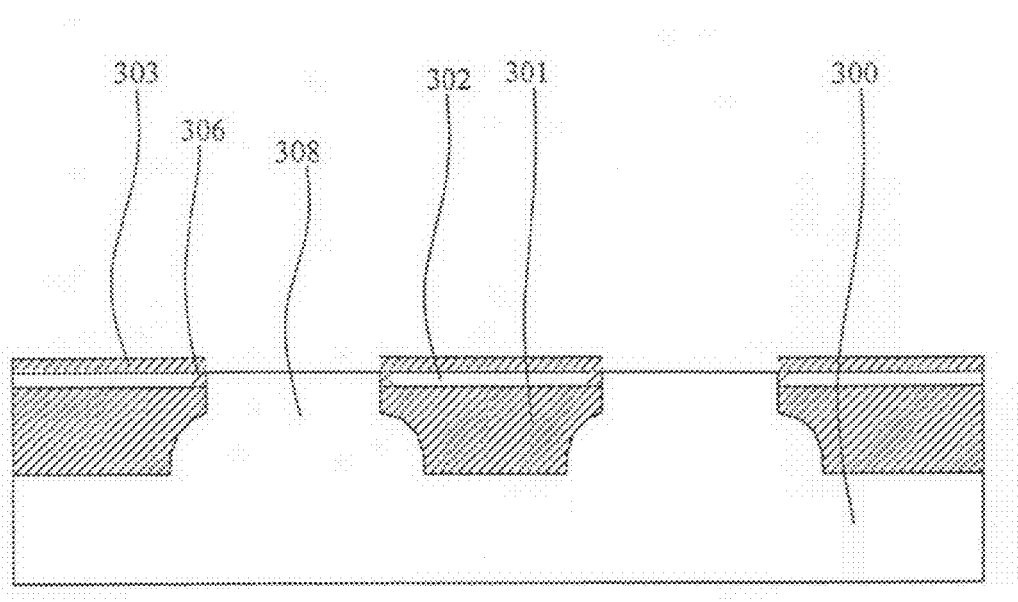
FIG. 13 shows a cross-section of the vertical bipolar transistor according to the invention during production on an SOI substrate wafer.

In a further step monocrystalline silicon layers 308 are deposited on the Si surfaces of the carrier substrate 300, which have been exposed in the opened windows (FIG. 13). A selective epitaxy process can preferably be used for that purpose. In a preferred embodiment of the process an oxide layer 309 is then deposited on the wafer which has been structured in that way.

Figure 14:
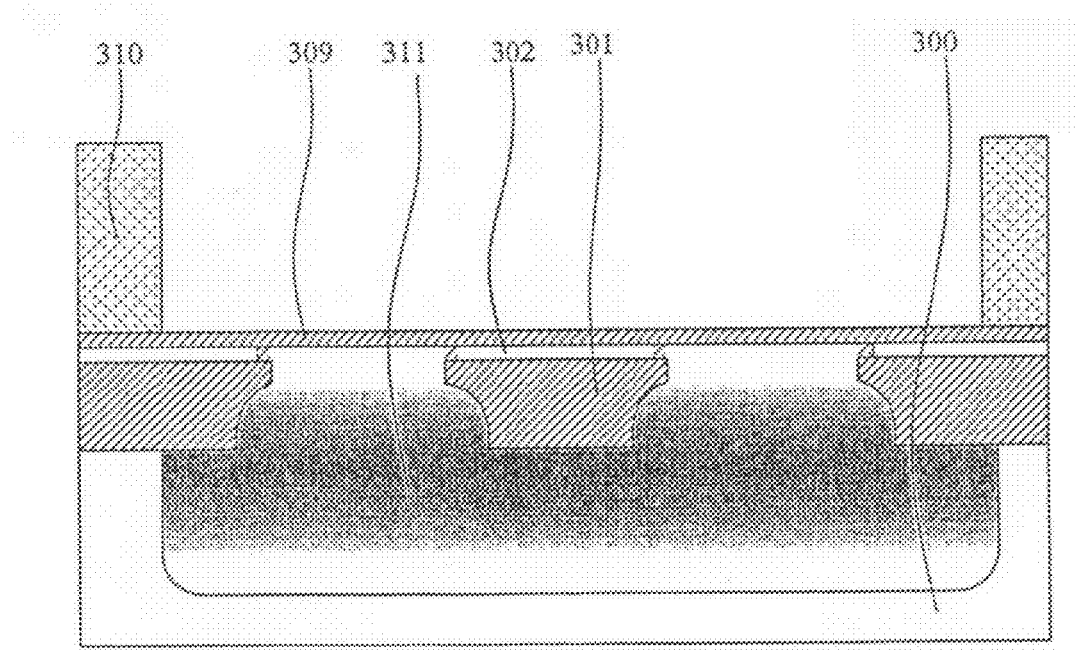
FIG. 14 shows a cross-section of the vertical bipolar transistor according to the invention during production on an SOI substrate wafer.

In a further step the collector regions and the collector connection regions are doped by means of a lacquer mask by the implantation of donor ions (phosphorus, arsenic or antimony) (FIG. 14). In a preferred embodiment of the invention the collector region 326 and the collector connection region 325 are separated from each other by a part which has remained of the buried oxide layer 301. In that case the energy of the implanted ions is so selected that the n-conducting collector trough 311 electrically connects the collector regions and the collector connection regions.

Figure 15:
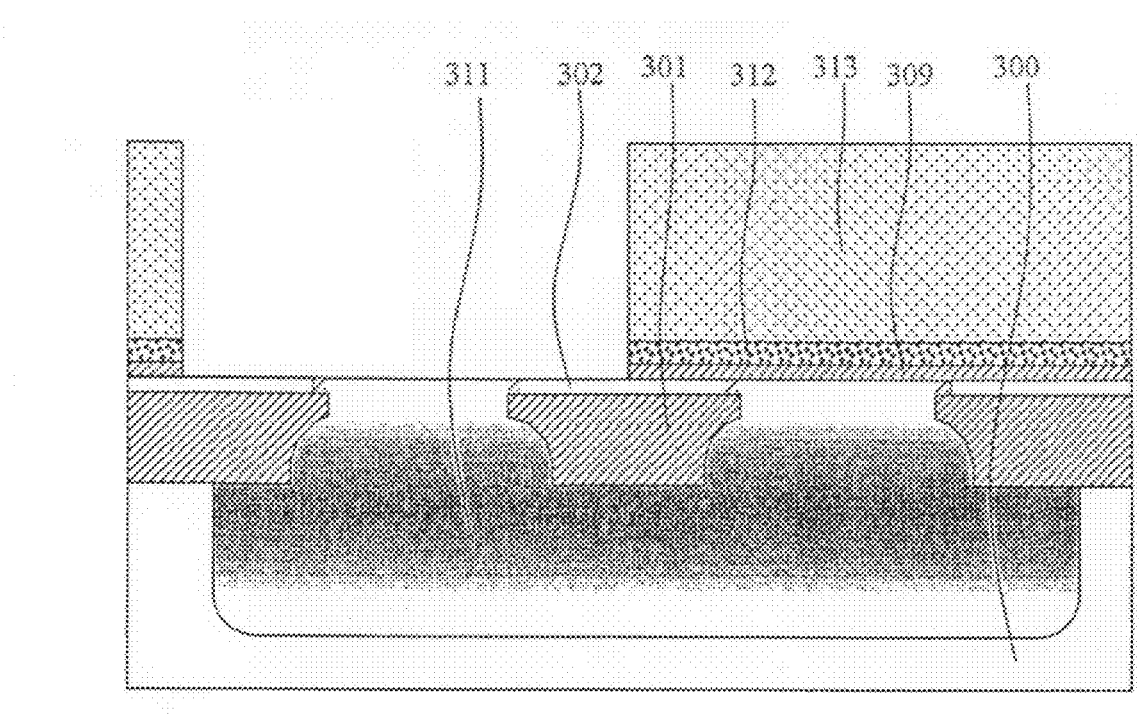
FIG. 15 shows a cross-section of the vertical bipolar transistor according to the invention during production on an SOI substrate wafer.

In a further step a further insulator layer 312 which comprises for example silicon nitride is deposited on the wafer. By means of a lacquer mask 313 the insulator layers 309 and 312 which are to be found on the Si surface are opened over the collector regions 326 and the adjoining base connection regions (FIG. 15).

Figure 16:
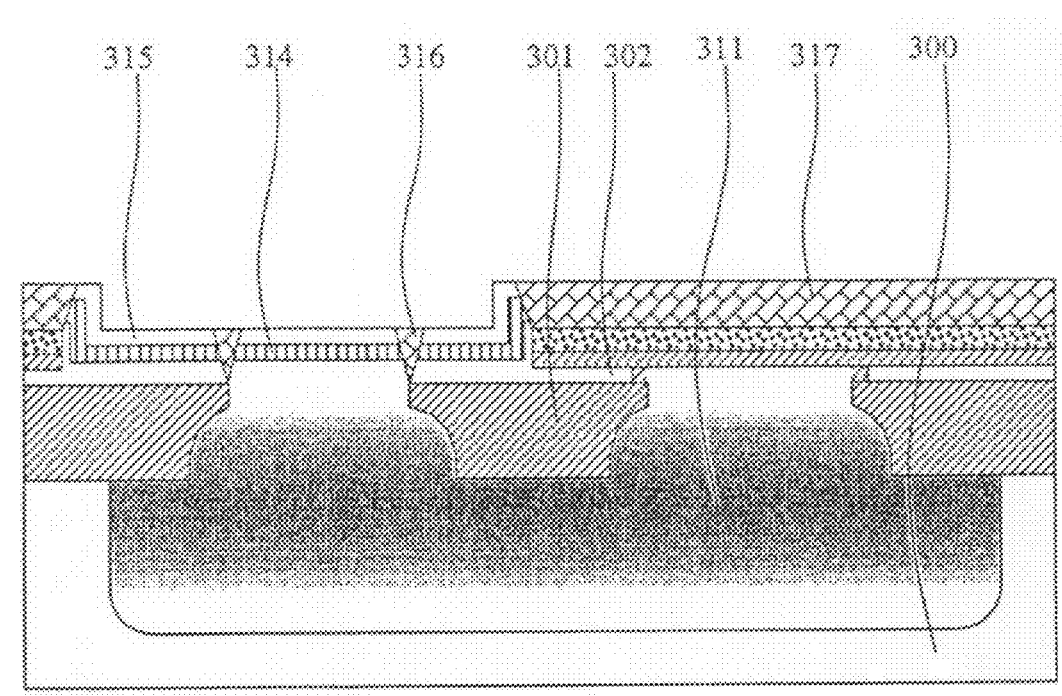
FIG. 16 shows a cross-section of the vertical bipolar transistor according to the invention during production on an SOI substrate wafer.

In a further step the base layer is deposited preferably by means of a differential epitaxy process. In particular the epitaxy base layer can include an SiGe layer 314 and a cover layer of silicon as indicated at 315 (FIG. 16). In this embodiment of the invention polycrystalline growth of the base layer takes place on the wafer regions which are covered with insulator layers 309 and 312. Preferably monocrystalline growth of the base layer occurs on the exposed silicon surfaces in the collector and base connection regions. Along the border of the collector region 326 the monocrystalline growth of the base layer can be disturbed in a restricted region 316.

In further steps in the process, by means of processes corresponding to the known state of the art, emitters 319 are deposited and structured and the emitter, base and collector regions are contacted (FIG. 10). In a preferred embodiment of the invention production of the emitter and the external base region is effected in accordance with the process described in embodiment 2.

What is claimed is:

1. A vertical heterobipolar transistor comprising:
   a substrate (210; 300) of semiconductor material of a first conductivity type and an insulation region (212; 327) provided therein,
   a first semiconductor region (220; 326) arranged in an opening in the insulation region (212; 327) and comprising monocrystalline semiconductor material of a second conductivity type which is either in the form of a collector or an emitter and which has a first heightwise portion (220a) which is enclosed by the insulation region in lateral directions (I) perpendicular to a heightwise direction (h) and has an adjoining second heightwise portion (230a) which is further away from the substrate interior in the heightwise direction (h) and which is laterally not enclosed by the insulation region,
   a second semiconductor region (260; 318) of semiconductor material of the second conductivity type which is in the form of the other type of semiconductor region and is thus in the form of an emitter or alternatively a collector respectively,
   a base (230c; 314) of monocrystalline semiconductor material of the first conductivity type between the collector and the emitter, and
   a base connection region (233; 320) which has a monocrystalline portion (233a, 233b, 233c, 233d, 233e) which in a lateral direction laterally surrounds the second heightwise portion (230a) of the first semiconductor region (220; 326), that is further towards the substrate interior as viewed from the base, and which with its underside facing towards the substrate interior is disposed directly on the insulation region (212; 327) and which is referred to hereinafter as a vertically insulated monocrystalline base connection region portion, for brevity a VIMBCR portion,
   wherein the lateral extent of a heightwise portion (233a) of the VIMBCR portion (233a, 233b, 233c, 233d, 233e) which laterally surrounds the second heightwise portion (230a) of the second semiconductor region (220) is greater than the spacing measured in the heightwise direction between an upper edge of the insulation region (212) and a lower edge of the base (230c).

2. A vertical bipolar transistor as set forth in claim 1 wherein that heightwise portion (233a) of the VIMBCR portion (233a, 233b, 233c, 233d, 233e) which laterally surrounds the second heightwise portion (230a) of the first semiconductor region (220) rests on the insulation region (212; 327) over a lateral extent of at least 10 nm.

3. A vertical bipolar transistor as set forth in claim 1 wherein that heightwise portion (233a) of the VIMBCR portion (233a, 233b, 233c, 233d, 233e) which laterally surrounds the second heightwise portion (230a) of the first semiconductor region (220) rests on the insulation region (212; 327) over a lateral extent of at least 30 nm.

4. A vertical bipolar transistor as set forth in claim 1 wherein that heightwise portion (233a) of the VIMBCR portion (233a, 233b, 233c, 233d, 233e) which laterally surrounds the second heightwise portion (230a) of the first semiconductor region (220) rests on the insulation region (212; 327) over a lateral extent of at least 70 nm.

5. A vertical bipolar transistor as set forth claim 1 wherein that heightwise portion (233a) of the VIMBCR portion (233a, 233b, 233c, 233d, 233e) which laterally surrounds the second heightwise portion (230a) of the first semiconductor region (220) rests on the insulation region (212; 327) over the entire lateral extent of the base connection region and wherein the entire base connection region is of a monocrystalline nature.

6. A vertical bipolar transistor as set forth in claim 1 wherein the relationship between the lateral extent of the heightwise portion (233a) of the VIMBCR portion (233a, 233b, 233c, 233d, 233e) which laterally surrounds the second heightwise portion (230a) of the first semiconductor region (220) and the spacing, measured in the heightwise direction, between the upper edge of the insulation region (212) and the lower edge of the base (230c) is between more than 1 and 10.

7. A vertical bipolar transistor as set forth in claim 1 wherein the heightwise extent of the heightwise portion (233a) of the VIMBCR portion (233a, 233b, 233c, 233d, 233e) which laterally surrounds the second heightwise portion (230a) of the first semiconductor region (220) is between 5 nm and 100 nm.

8. A vertical bipolar transistor as set forth in claim 1 wherein the heightwise extent of the heightwise portion (233a) of the VIMBCR portion (233a, 233b, 233c, 233d, 233e) which laterally surrounds the second heightwise portion (230a) of the first semiconductor region (220) is between 20 nm and 50 nm.

9. A vertical bipolar transistor as set forth in claim 1 wherein a polycrystalline lateral portion (231; 316) of the base connection region adjoins the VIMBCR portion (233a, 233b, 233c, 233d, 233e) on its side remote from the base.

10. A vertical bipolar transistor as set forth in claim 1 wherein the VIMBCR portion in a lateral direction adjoins the first semiconductor region without one-dimensional or multi-dimensional dislocations or lattice mismatches.

11. A vertical bipolar transistor as set forth in claim 1 wherein the insulation region (212) is arranged in an opening in a field insulation region (211).

12. A vertical bipolar transistor as set forth in claim 1 wherein the heightwise extent of the insulation region is in the region of between 10 nm and 250 nm.

13. A vertical bipolar transistor as set forth in claim 1 wherein the insulation region has a pit filled with the material of the base connection region.

14. A vertical bipolar transistor as set forth in claim 1 wherein as viewed in cross-section the first heightwise portion of the first semiconductor reqion (220) narrows towards the second heightwise portion (230a).

15. A vertical bipolar transistor as set forth in claim 14 wherein as viewed in cross-section, the minimum lateral extent of the narrowing first heightwise portion (220) of the first semiconductor region is of the same size as or smaller than the maximum lateral extent of the second semiconductor region (260).

16. A vertical bipolar transistor as set forth in claim 15 wherein the first semiconductor region is in the form of the emitter and the second semiconductor region is in the form of the collector and the bipolar transistor is thus adapted for a reverse mode of operation.

17. A vertical bipolar transistor as set forth in claim 1 wherein the first semiconductor region (220) is in the form of the collector and the second semiconductor region (260) is in the form of the emitter.

18. A vertical bipolar transistor as set forth in claim 1 wherein a buffer layer (230b) of monocrystalline semiconductor material is arranged between the second heightwise portion (230a) of the first semiconductor region and the base (230c).

19. A vertical bipolar transistor as set forth in claim 1 wherein a cover layer (230d) of monocrystalline semiconductor material is arranged between the base (230c) and the second semiconductor region (260).

20. A vertical bipolar transistor as set forth in claim 1 wherein the second semiconductor region is T-shaped.

21. A vertical bipolar transistor as set forth in claim 1 wherein in the first heightwise portion (220a) or in the second heightwise portion (230a) the first semiconductor region includes a plurality of layers of different material composition or a plurality of layer portions with a dopant concentration of differing magnitude.

22. A vertical bipolar transistor as set forth in claim 1 wherein the substrate is an SOI substrate.

23. A vertical bipolar transistor as set forth in claim 22 wherein a silicon cover layer of the SOI substrate is of a thickness of less than 50 nm.

24. A vertical bipolar transistor as set forth in claim 22 wherein a lateral portion (316) of the base connection region, which has one-dimensional or multi-dimensional dislocations or lattice mismatches, is laterally delimited by the VIM-BCR portion and a second monocrystalline portion of the base connection region is in adjoining relationship on its (316) side remote from the base.

25. A vertical bipolar transistor as set forth in claim 23 wherein the polycrystalline lateral portion (316) of the base connection region is of a lateral extent of a maximum of 80 nm.

* * * * *

UNITED STATES PATENT AND TRADEMARK OFFICE
CERTIFICATE OF CORRECTION

| | | |
|---|---|---|
| PATENT NO. | : 7,880,270 B2 | Page 1 of 1 |
| APPLICATION NO. | : 11/792015 | |
| DATED | : February 1, 2011 | |
| INVENTOR(S) | : Heinemann et al. | |

It is certified that error appears in the above-identified patent and that said Letters Patent is hereby corrected as shown below:

In column 20, line 44, which is claim 14, line 3, "reqion" should be --region--.

Signed and Sealed this
Seventh Day of June, 2011

David J. Kappos
*Director of the United States Patent and Trademark Office*